United States Patent
Collins et al.

(10) Patent No.: US 7,402,890 B2
(45) Date of Patent: Jul. 22, 2008

(54) METHOD FOR SYMMETRIC CAPACITOR FORMATION

(75) Inventors: David S. Collins, Williston, VT (US); Hanyi Ding, Essex Junction, VT (US); Kai Di Feng, Essex Junction, VT (US); Zhong-Xiang He, Essex Junction, VT (US); Xuefeng Liu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 86 days.

(21) Appl. No.: 11/421,774

(22) Filed: Jun. 2, 2006

(65) Prior Publication Data

US 2007/0278618 A1     Dec. 6, 2007

(51) Int. Cl.
*H01L 29/00* (2006.01)
(52) U.S. Cl. .............. 257/532; 257/E21.364; 438/393; 438/394; 438/395
(58) Field of Classification Search .......... 257/E21.364, 257/532, E21.351; 438/393–395
See application file for complete search history.

(56) References Cited

U.S. PATENT DOCUMENTS

| | | | |
|---|---|---|---|
| 6,190,964 B1 * | 2/2001 | Winters .............. | 438/254 |
| 6,385,033 B1 * | 5/2002 | Javanifard et al. ........ | 361/306.2 |
| 6,743,671 B2 | 6/2004 | Hu et al. | |
| 6,867,107 B2 * | 3/2005 | Asai et al. .............. | 438/379 |
| 7,087,468 B2 * | 8/2006 | Gonzalez et al. .......... | 438/129 |
| 2001/0040270 A1 * | 11/2001 | Kobayashi .............. | 257/531 |
| 2004/0140527 A1 * | 7/2004 | Furuya et al. ............ | 257/532 |
| 2004/0207041 A1 | 10/2004 | De Maaijer | |
| 2005/0017321 A1 | 1/2005 | Hakkarainen et al. | |

FOREIGN PATENT DOCUMENTS

WO     WO 03/009383 A1     1/2003

* cited by examiner

*Primary Examiner*—Thomas Dickey
*Assistant Examiner*—Ben P Sandvik
(74) *Attorney, Agent, or Firm*—Schmeiser, Olson & Watts; William D. Sabo

(57) ABSTRACT

A structure and associated method for forming a structure. The structure comprises a first doped region, a second doped region, a third doped region, and a first shallow trench isolation structure formed within a substrate. The first doped region comprises a first dopant having a first polarity. The second doped region forms a first electrode of a capacitor. The third doped region forms a second electrode of the capacitor. Each of the second doped region and the third doped region comprises a second dopant having a second polarity. The first shallow trench isolation structure is formed between the second doped region and the third doped region. The capacitor comprises a main capacitance. The structure comprises a first parasitic capacitance and a second parasitic capacitance. The first parasitic capacitance is about equal to the second parasitic capacitance.

10 Claims, 6 Drawing Sheets

METHOD FOR SYMMETRIC CAPACITOR FORMATION

BACKGROUND OF THE INVENTION

1. Technical Field

The present invention relates to a semiconductor device comprising a symmetric capacitor structure.

2. Related Art

A device within an electrical structure typically does not comprise terminals extending from the device that comprise equivalent electrical properties. Terminals that do not comprise equivalent electrical properties may cause other devices within the electrical structure to operate inefficiently. Thus, there is a need for a structure and associated method for forming an electrical structure with terminals comprising equivalent electrical properties.

SUMMARY OF THE INVENTION

The present invention provides a structure, comprising:

a first doped region formed within a substrate, wherein said first doped region comprises a first dopant having a first polarity;

a second doped region formed within said substrate and over said first doped region, wherein said second doped region forms a first electrode of a symmetric capacitor;

a third doped region formed within said substrate and over first doped region, wherein said third doped region forms a second electrode of said symmetric capacitor, wherein each of said second doped region and said third doped region comprises a same second dopant having a second polarity, wherein each of said second doped region and said third doped region is formed simultaneously, and wherein said first doped region, said second doped region, and said third doped region in combination form a PN junction; and a first shallow trench isolation structure formed between said second doped region and said third doped region, wherein said first shallow trench isolation structure electrically isolates said second doped region from said third doped region, wherein said symmetric capacitor comprises a main capacitance, wherein said structure comprises a first parasitic capacitance and a second parasitic capacitance, wherein said main capacitance comprises a capacitance between said second doped region and said third doped region, wherein said first parasitic capacitance represents a parasitic connection between said second doped region and said first doped region, wherein said second parasitic capacitance represents a parasitic connection between said third doped region and said first doped region, wherein a first distance between said second doped region and said first doped region is about equal to a second distance between said third doped region and said first doped region, and wherein said first parasitic capacitance is about equal to said second parasitic capacitance.

The present invention provides a method for forming a structure, comprising:

providing, a substrate;

forming, a first doped region within said silicon substrate, wherein said first doped region comprises a first dopant having a first polarity;

forming, a second doped region within said substrate and over first doped region, wherein said second doped region forms a first electrode of a capacitor;

forming, a third doped region within said substrate and over first doped region, wherein said third doped region forms a second electrode of said capacitor, wherein each of said second doped region and said third doped region comprises a same second dopant having a second polarity, wherein said forming said second doped region and said forming said third doped region is performed simultaneously, and wherein said first doped region, said second doped region, and said third doped region in combination form a PN junction; and forming, a first shallow trench isolation structure between said second doped region and said third doped region, wherein said first shallow trench isolation structure isolates said second doped region from said third doped region, wherein said capacitor comprises a main capacitance, wherein said structure comprises a first parasitic capacitance and a second parasitic capacitance, wherein said main capacitance comprises a capacitance between said second doped region and said third doped region, wherein said first parasitic capacitance represents a parasitic connection between said second doped region and said first doped region, wherein said second parasitic capacitance represents a parasitic connection between said third doped region and said first doped region, wherein a first distance between said second doped region and said first doped region is about equal to a second distance between said third doped region and said first doped region, and wherein said first parasitic capacitance is about equal to said second parasitic capacitance.

The present invention advantageously provides a structure and associated method for forming a symmetric capacitor with terminals comprising equivalent electrical properties.

DETAILED DESCRIPTION OF THE INVENTION

Figure 1:
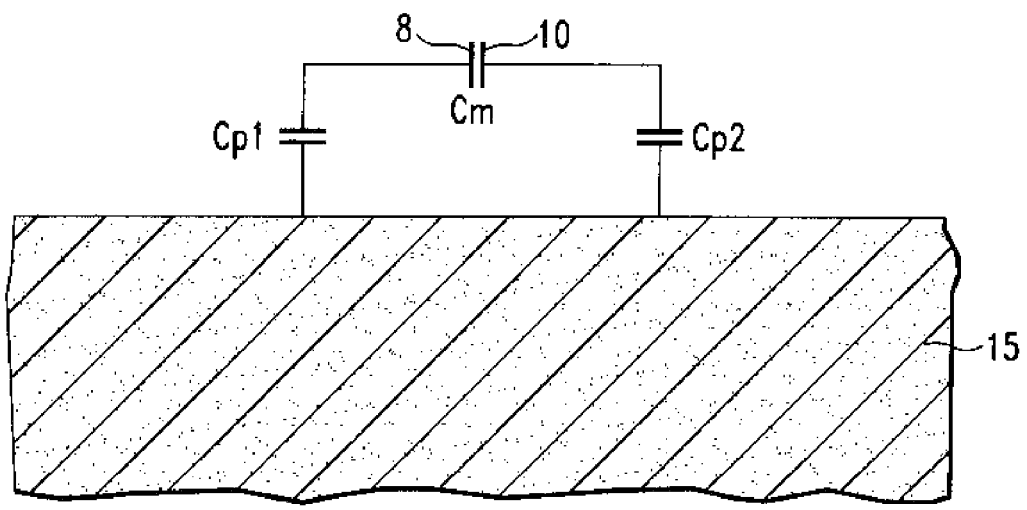
FIG. 1 illustrates a schematic diagram of an equivalent circuit for a capacitor formed within a semiconductor device, in accordance with embodiments of the present invention.

FIG. 1 illustrates a schematic diagram of an equivalent circuit for a capacitor 9 formed within a semiconductor device 2, in accordance with embodiments of the present invention. The capacitor 9 comprises a main capacitor (Cm), a first parasitic capacitor (Cp1) and a second parasitic capacitor (Cp2). The first parasitic capacitor Cp1 represents a parasitic connection from a first electrode 8 of the main capacitor Cm to a semiconductor (e.g., silicon) substrate 15 within the semiconductor device 2. The second parasitic capacitor Cp2 represents a parasitic connection from a second electrode 10 of the main capacitor Cm to the substrate 15. The main capacitor Cm is a high density capacitor comprising a density of about 0.15 fF/um² to about 5.0 fF/um². A distance from the first electrode 8 of the main capacitor Cm to the semiconductor (e.g., silicon) substrate 15 is about equal to a distance from the second electrode 10 of the main capacitor Cm to the semiconductor (e.g., silicon) substrate 15 and therefore the first parasitic capacitor Cp1 comprises a capacitance that is about equal to the second parasitic capacitor Cp2. The about equal capacitance values of the first parasitic capacitor Cp1 and the second parasitic capacitor Cp2 cause the capacitor 9 to be a symmetric capacitor. Additionally, the capacitor 9 comprises a high (e.g., 50 to 1) ratio of main capacitance (i.e., capacitance of main capacitor Cm) to parasitic capacitance (capacitance values of the first parasitic capacitor Cp1 and the second parasitic capacitor Cp2).

FIGS. 2A-2G illustrates and details stages in a fabrication process of the capacitor 9 of FIG. 1, in accordance with embodiments of the present invention. FIGS. 2A-2G represents a cross sectional view. The fabrication process described with respect to FIGS. 2A-2G illustrates the formation of the capacitor 9 within a semiconductor device 2. The semiconductor device 2 may be, inter alia, a semiconductor chip.

Figure 2A:
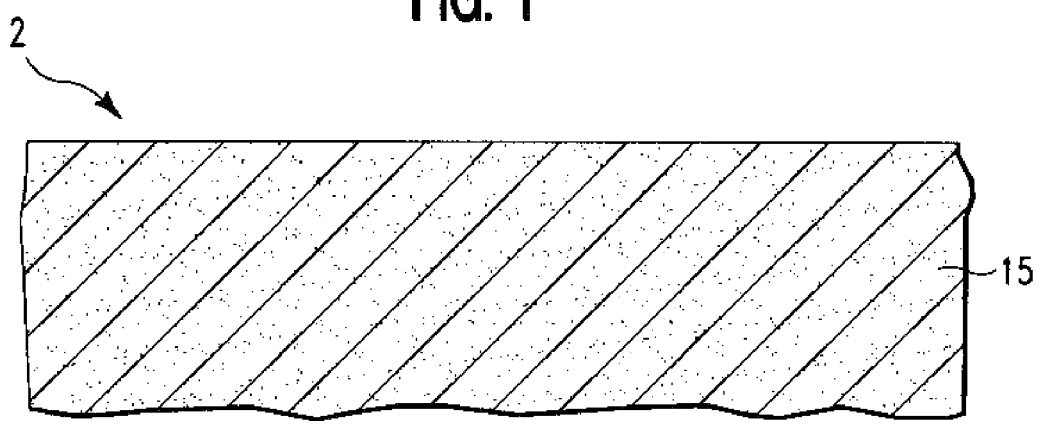
FIGS. 2A-2G illustrates stages in a fabrication process of the capacitor of FIG. 1, in accordance with embodiments of the present invention.

In FIG. 2A, a substrate 15 within a semiconductor device 2 is provided for the fabrication process, in accordance with embodiments of the present invention. The substrate 15 may include, inter alia, a silicon substrate, a SOI substrate, a GaAs substrate, an InP substrate, etc.

Figure 2B:
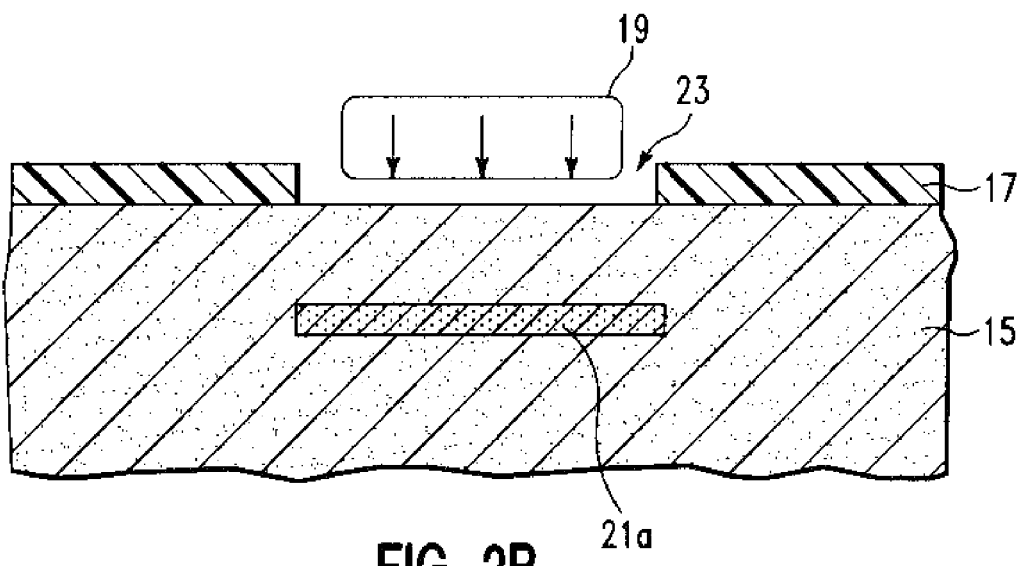

FIG. 2B illustrates substrate 15 of FIG. 2A after a resist layer 17 has been deposited (and patterned) over portions of the substrate 15, in accordance with embodiments of the present invention. The resist layer 17 may be patterned using, inter alia, a lithography process, a lithography process with a dry etch or wet etch, etc. Ion implant 19 is directed at a portion 23 of the substrate 15 in order to form a first doped region 21a in the substrate 15. Ion implant 19 may comprise, inter alia, a deep ion implementation, a shallow ion implementation, etc. The first doped region 21a may comprise an N+ dopant (e.g., phosphorus, arsenic, antimony, etc) or a P+ type (e.g., boron, aluminum, gallium, indium, etc).

Figure 2C:
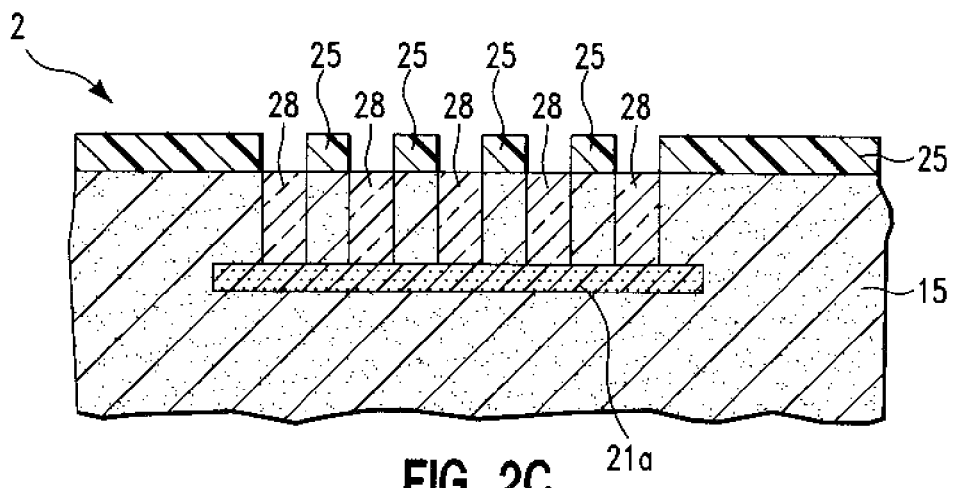

FIG. 2C illustrates the substrate 15 of FIG. 2B after resist layer 17 has been removed and a resist layer 25 has been deposited (and patterned) over portions of the substrate 15, in accordance with embodiments of the present invention. In order to form the shallow trench isolation structures 28, exposed portions of the substrate 15 (i.e., portions that are not protected by the resist layer 25) have been removed (e.g., using an etching process) so that the shallow trench isolation structures 28 may be formed within trenches formed by removing the exposed portions of the resist layer 25. The resist layer 25 may be patterned using, inter alia, a lithography process, a lithography process with a dry etch or wet etch, etc. The resist layer 25 is removed prior to the filling of shallow trench with a dielectric material. The shallow trench isolation structures 28 may comprise an oxide or high-K dielectric material. A high-K dielectric material is defined herein as a dielectric material comprising a dielectric constant that is greater than or equal to about 20.

Figure 2D:
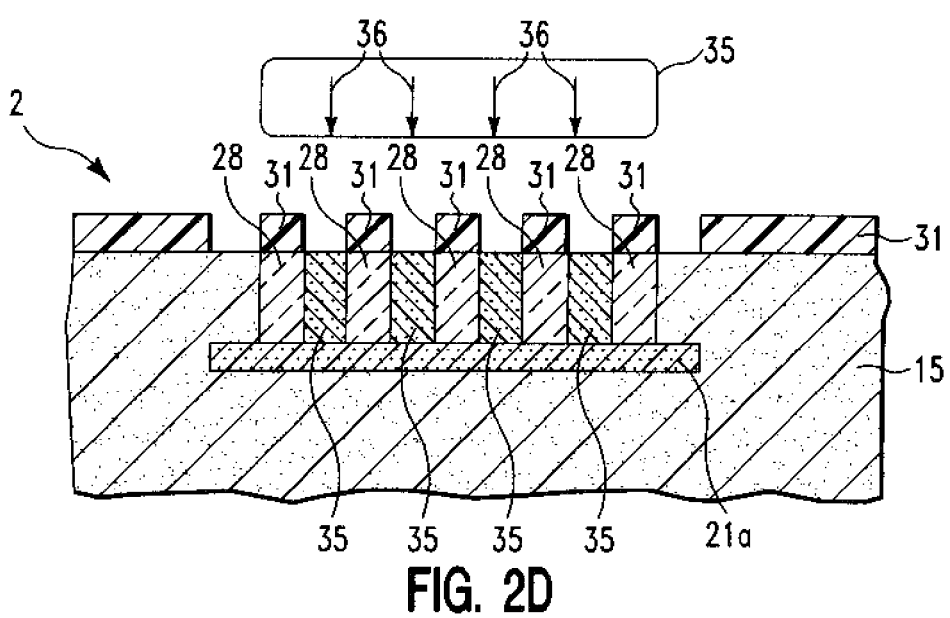

FIG. 2D illustrates the substrate 15 of FIG. 2C after resist layer 25 has been removed and a resist layer 31 has been deposited (and patterned) over the shallow trench isolation structures 28, in accordance with embodiments of the present invention. Ion implant 34 is directed at the exposed portions of the substrate 15 in order to simultaneously form doped regions 35 in the substrate 15. Ion implant 34 may comprise, inter alia, a deep ion implementation, a shallow ion implementation, etc. The doped regions 35 have an opposite polarity to a polarity of the doped region 21a. The doped regions 35 may comprise a P+ type dopant (e.g., boron, aluminum, gallium, indium, etc) or a N+ dopant (e.g., phosphorus, arsenic, antimony, etc). The doped regions 35 form electrodes 8 and 10 of capacitor 9 of FIG. 1.

Figure 2E:
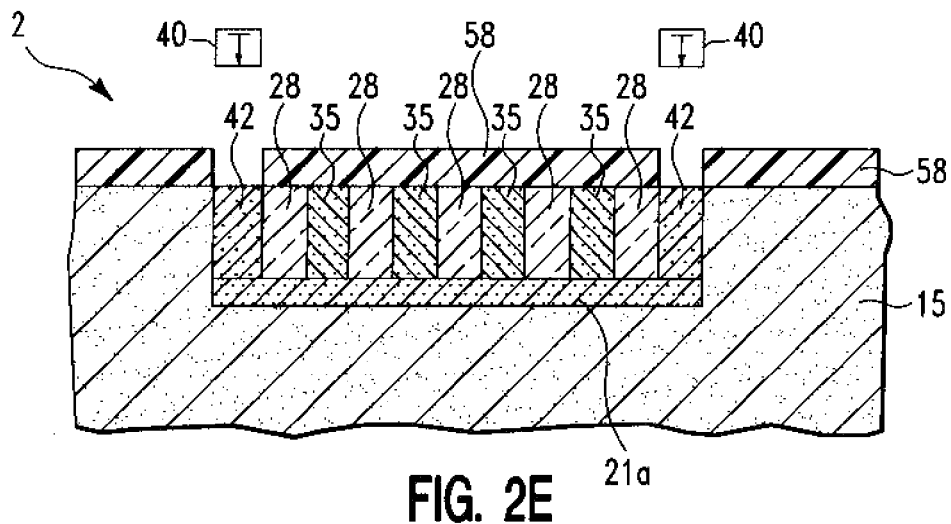

FIG. 2E illustrates the substrate 15 of FIG. 2D after resist layer 31 has been removed and a resist layer 58 has been deposited (and patterned) over the shallow trench isolation structures 28 and the doped regions 35, in accordance with embodiments of the present invention. Ion implant 40 is directed at the exposed portions of the substrate 15 in order to form doped regions 42 in the substrate 15. Ion implant 40 may comprise, inter alia, a deep ion implementation, a shallow ion implementation, etc. The doped regions 42 have a same type of dopant as the first doped region 21a. The doped regions 42 may comprise an N+ dopant (e.g., phosphorus, arsenic, antimony, etc) or a P+ dopant (e.g., boron, aluminum, gallium, indium, etc). The doped regions 42 are electrically shorted to the first doped region 21a. The doped regions 35 in combination with the doped region 21a form a PN junction. The doped regions are biased electrically such that the PN junction is reverse biased.

Figure 2F:
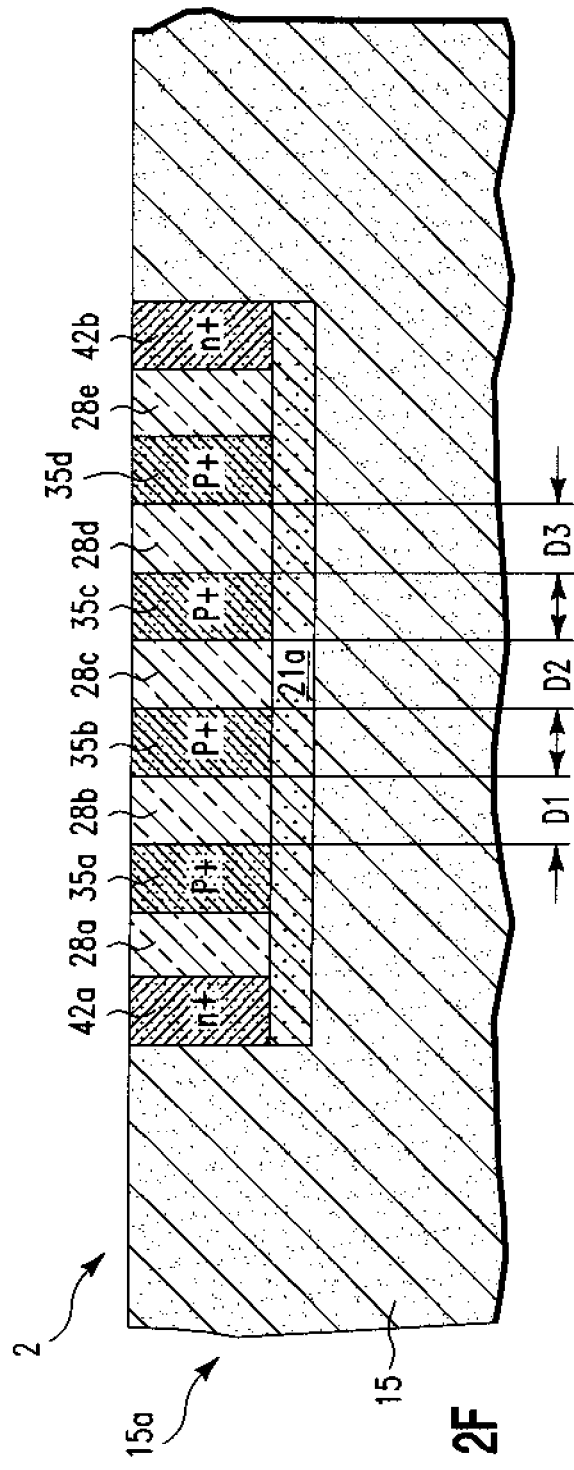

FIG. 2F illustrates a substrate structure 15a formed from the substrate 15 of FIG. 2E comprising the capacitor 9 from FIG. 1, in accordance with embodiments of the present invention. The substrate structure 15a comprises all of the structures formed in the substrate 15 during the process illustrated in FIGS. 2A-2E. The substrate 15 comprises a P-type substrate. The first doped region 21a comprises an N+ doped region. The doped regions 42a and 42b comprise N+ doped regions. The first doped region 21a is electrically connected to the doped regions 42a and 42b. The capacitor Cm is formed by P+ doped regions 35a, 35b, 35c, 35d, and the shallow trench isolation structures 28a . . . 28e. The capacitor Cm utilizes the P+ doped regions 35a, 35b, 35c, and 35d as electrodes or plates for the capacitor Cm (i.e., 35a and 35c form a first electrode and 35b and 35d form a second electrode). The P+ doped region 35a is isolated from the P+ doped region 35b by the shallow trench isolation structure 28b. The P+ doped region 35b is isolated from the P+ doped region 35c by the shallow trench isolation structure 28c. The P+ doped region 35c is isolated from the P+ doped region 35d by the shallow trench isolation structure 28d. A capacitance comprised by the capacitor Cm is controlled by a distance D1 between the P+ doped region 35a and the P+ doped region 35b (i.e., a width of the shallow trench isolation structure 28b), a distance D2 between the P+ doped region 35b and the P+ doped region 35c (i.e., a width of the shallow trench isolation structure 28c), a distance D3 between the P+ doped region 35c and the P+ doped region 35d (i.e., a width of the shallow trench isolation structure 28d) and an area (i.e., a plate area) of the P+ doped region 35a . . . 35d. A first parasitic capacitor (e.g., see Cp1 in FIG. 1) represents a parasitic connection between the P+ doped region 35a and 35c (i.e., a first electrode of the capacitor Cm) and the first doped region 21a. A second parasitic capacitor (e.g., see Cp2 in FIG. 1) represents a parasitic connection between the P+ doped region 35b and 35d (i.e., a second electrode of the capacitor Cm) and the first doped region 21a. A distance (e.g., about 1500 angstroms to 5000 angstroms) from the P+ doped region 35a and 35c (i.e., a first electrode of the capacitor Cm) to the first doped region 21a is about equal to a distance (e.g., about 1500 angstroms to 5000 angstroms) from the P+ doped region 35b and 35d (i.e., a second electrode of the capacitor Cm) to the first doped region 21a and therefore the first parasitic capacitor Cp1 comprises a capacitance that is about equal to the second parasitic capacitor Cp2. The about equal capacitance values of the first parasitic capacitor Cp1 and the second parasitic capacitor Cp2 cause the capacitor Cm to be a symmetric capacitor. Additionally, the capacitor Cm comprises a high (e.g., 50 to 1) ratio of main capacitance (i.e., capacitance of capacitor Cm) to parasitic capacitance (capacitance values of the first parasitic capacitor Cp1 and the second parasitic capacitor Cp2). The capacitor Cm in FIG. 2F is high density capacitor comprising a density of about 0.15 fF/um². A voltage may be applied to the first doped region 21a (i.e., an N+ region) through the doped regions 42a and 42b. The capacitors Cm is isolated from the substrate 15.

Figure 2G:
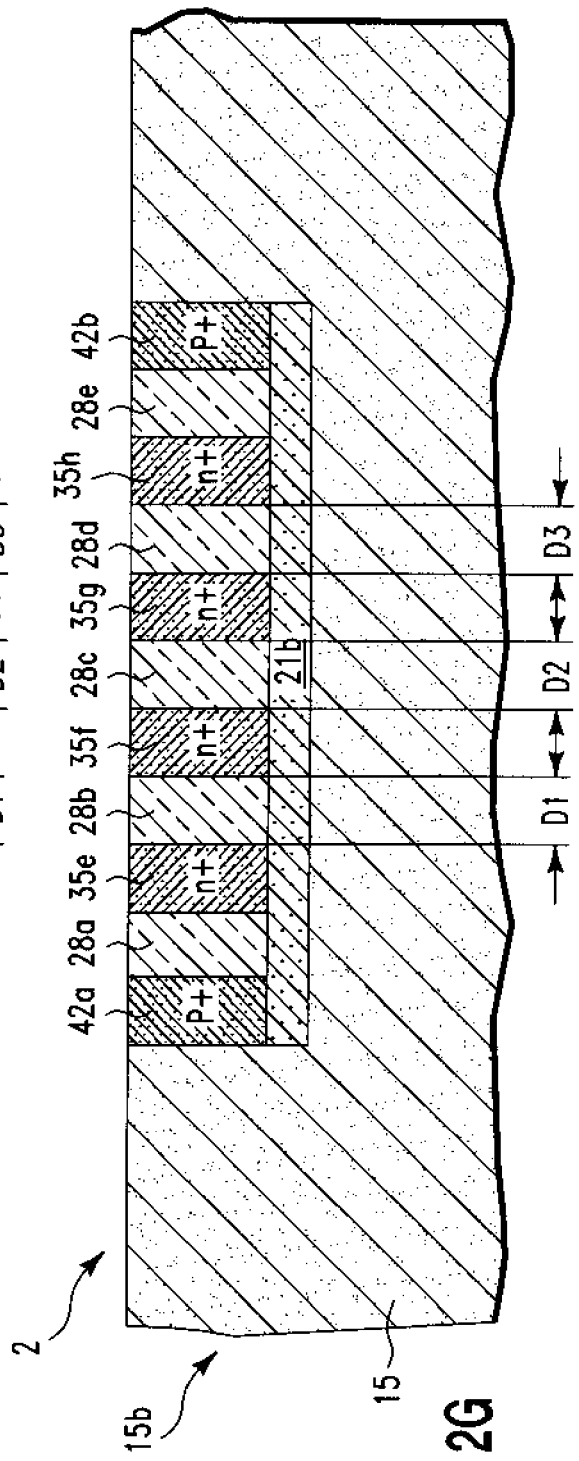

FIG. 2G illustrates an alternative substrate structure 15b to the substrate structure 15a of FIG. 2F, in accordance with embodiments of the present invention. In contrast with FIG. 2F, a doped region 21b comprises a P+ doped region. The doped regions 42c and 42d comprise P+ doped regions. The first doped region 21b is electrically connected to the doped regions 42c and 42d. The capacitor Cm is formed by N+ doped regions 35e . . . 35h and the shallow trench isolation structures 28b, 28c, and 28d. The capacitor Cm utilizes the N+ doped regions 35e, 35f, 35g, and 35h as electrodes or plates for the capacitor Cm. The N+ doped region 35e is isolated from the N+ doped region 35f by the shallow trench isolation structure 28b. The N+ doped region 35f is isolated from the N+ doped region 35g by the shallow trench isolation structure 28c. The N+ doped region 35g is isolated from the N+ doped region 35h by the shallow trench isolation structure 28c. A capacitance comprised by the capacitor Cm is controlled by a distance D1 between the P+ doped region 35e and the P+ doped region 35f (i.e., a width of the shallow trench isolation structure 28b), a distance D2 between the P+ doped region 35f and the P+ doped region 35g (i.e., a width of the shallow trench isolation structure 28c), a distance D3 between the P+ doped region 35g and the P+ doped region 35h (i.e., a width of the shallow trench isolation structure 28d) and an area (i.e., a plate area) of the P+ doped region 35e . . . 35h. A voltage may be applied to the first doped region 21b (i.e., a P+ region) through the P+ doped regions 42c and 42d. The capacitor Cm is isolated from the substrate 15.

Figure 2I:
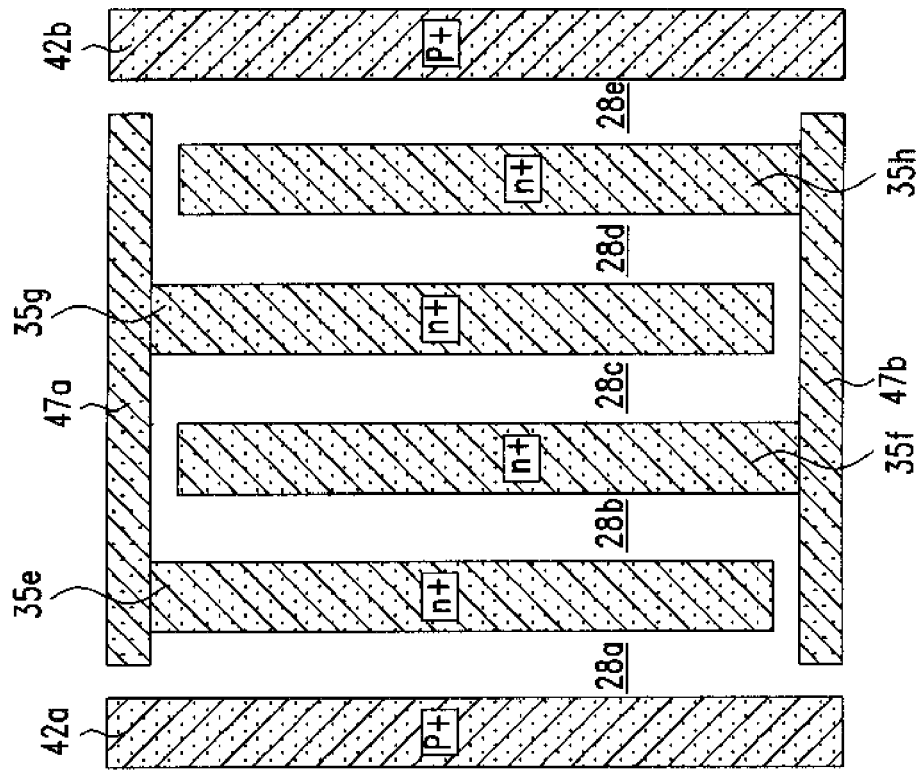
FIG. 2I illustrates a top view of the substrate structure in the semiconductor device of FIG. 2G, in accordance with embodiments of the present invention.
Figure 2H:
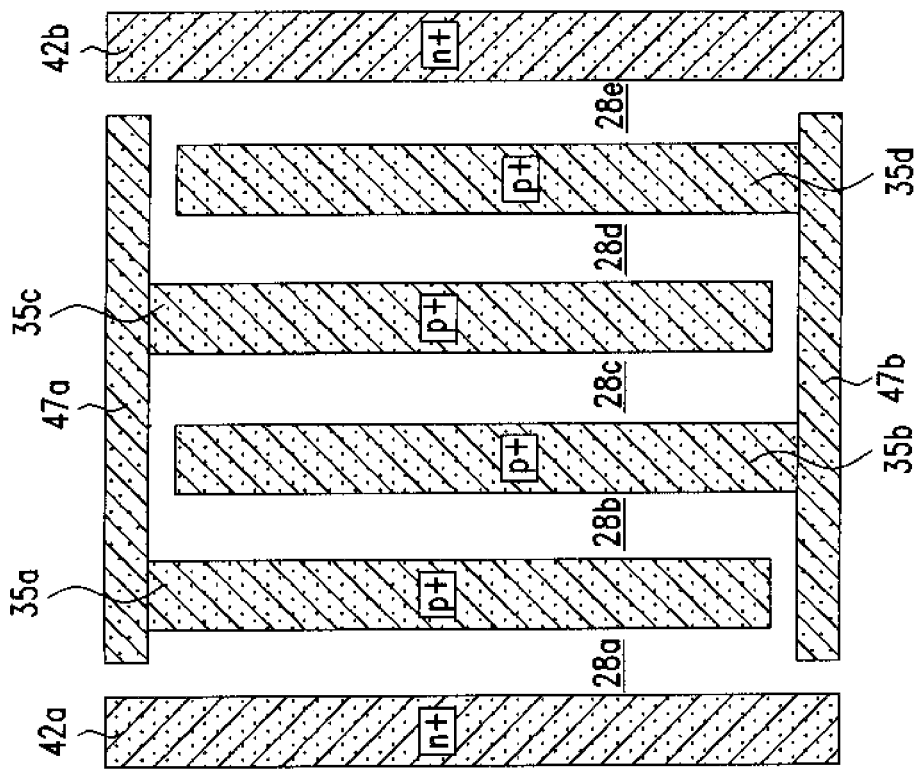
FIG. 2H illustrates a top view of the substrate structure in the semiconductor device of FIG. 2F, in accordance with embodiments of the present invention.

FIG. 2H illustrates a top view of the substrate structure 15a in the semiconductor device 2 of FIG. 2F, in accordance with embodiments of the present invention. In addition to the substrate structure 15a of FIG. 2F, the substrate structure 15a in FIG. 2H illustrates a terminal 47a electrically connected to P+ doped regions 35a and 35c and a terminal 47b electrically connected to P+ doped regions 35b and 35d. The terminals 47a and 47b are for connecting the capacitor Cm to another circuit.

FIG. 2I illustrates a top view of the substrate structure 15b in the semiconductor device 2 of FIG. 2G, in accordance with embodiments of the present invention. In addition to the substrate structure 15b of FIG. 2G, the substrate structure 15a in FIG. 2I illustrates a terminal 47a electrically connected to N+ doped regions 35e and 35g and a terminal 47b electrically connected to N+ doped regions 35f and 35h. The terminals 47a and 47b are for connecting the capacitor Cm to another circuit.

Figure 3A:
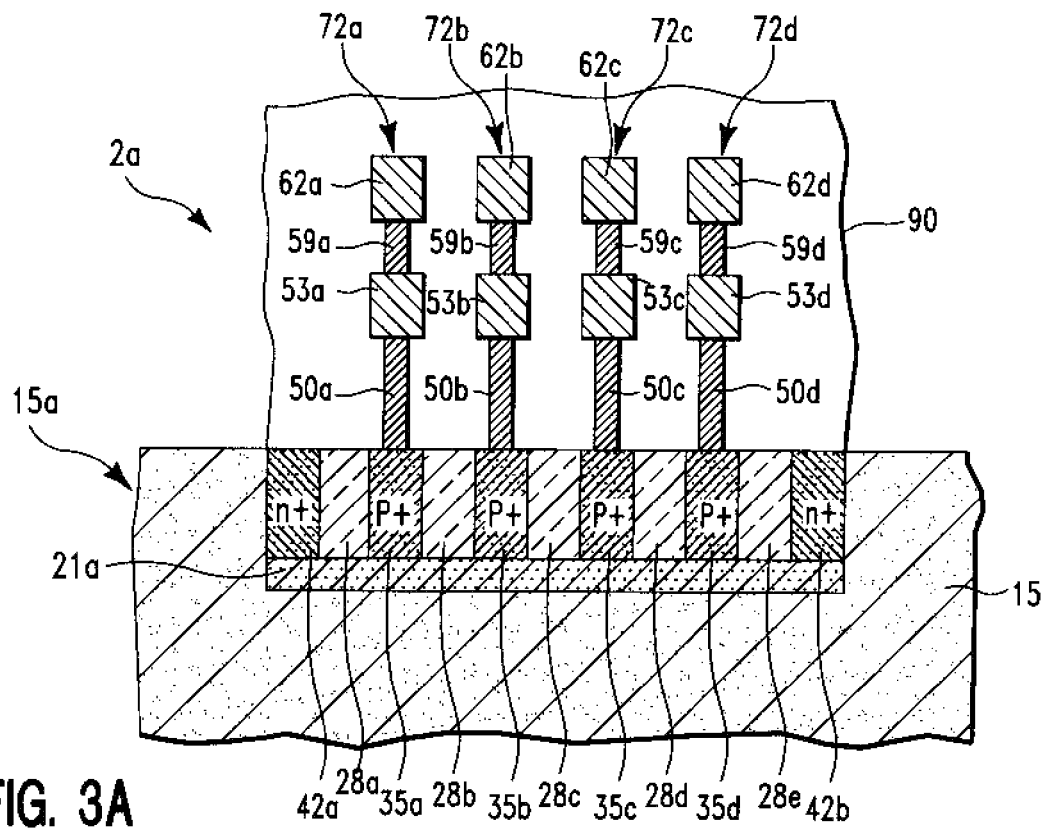
FIG. 3A illustrates an alternative semiconductor device to the semiconductor device of FIG. 2F, in accordance with embodiments of the present invention.

FIG. 3A illustrates an alternative semiconductor device 2a to the semiconductor device 2 of FIG. 2F, in accordance with embodiments of the present invention. In contrast with the semiconductor device 2 of FIG. 2F, the semiconductor device 2a of FIG. 3A comprises vertical parallel plate (VPP) structures 72a . . . 72d. The VPP structures 72a . . . 72d increase an area for the electrodes or plates 35a . . . 35d and therefore allows the capacitor Cm in FIG. 3A to achieve a higher capacitance value than the capacitor Cm in FIG. 2F while maintaining a low parasitic capacitance (i.e., capacitance for Cp1 and Cp2 in FIG. 1) thereby maintaining a high (e.g., 50 to 1) ratio of main capacitance (i.e., capacitance of capacitor Cm) to parasitic capacitance (capacitance values of the first parasitic capacitor Cp1 and the second parasitic capacitor Cp2). The VPP structure 72a is electrically connected to the doped region 35a, the VPP structure 72b electrically connected to the doped region 35b, the VPP structure 72c is electrically connected to the doped region 35c, and the VPP structure 72d is electrically connected to the doped region 35d. The VPP structure 72a comprises a wire structure 62a, a wire structure 53a, a contact via 59a, and a contact 50a. The contact via 59a electrically connects the wire structure 62a to the wire structure 53a. The contact 50a electrically connects the doped region 35a to the wire structure 53a. The VPP structure 72b comprises a wire structure 62b, a wire structure 53b, a contact via 59b, and a contact 50b. The contact via 59b electrically connects the wire structure 62b to the wire structure 53b. The contact 50b electrically connects the doped region 35b to the wire structure 53b. The VPP structure 72c electrically connected to the doped region 35c and the VPP structure 72d is electrically connected to the doped region 35d. The VPP structure 72c comprises a wire structure 62c, a wire structure 53c, a contact via 59c, and a contact 50c. The contact via 59c electrically connects the wire structure 62c to the wire structure 53c. The contact 50c electrically connects the doped region 35c to the wire structure 53c. The VPP structure 72d comprises a wire structure 62d, a wire structure 53d, a contact via 59d, and a contact 50d. The contact via 59d electrically connects the wire structure 62d to the wire structure 53d. The contact 50d electrically connects the doped region 35d to the wire structure 53d. The capacitor Cm in FIG. 3A is a high density capacitor comprising a density of about 0.65 fF/um². A dielectric layer(s) 90 may be formed over the substrate structure 15a and surrounding the VPP structures 72a . . . 72d. The dielectric layer(s) 90 may comprise, inter alia, a standard BEOL dielectric film(s) such as undoped silicate glass, fluorinated silicate glass, a low k dielectric layer(s), etc. A low k dielectric is defined herein as a dielectric material comprising a dielectric constant that is less than or equal to about 3.

Figure 3B:
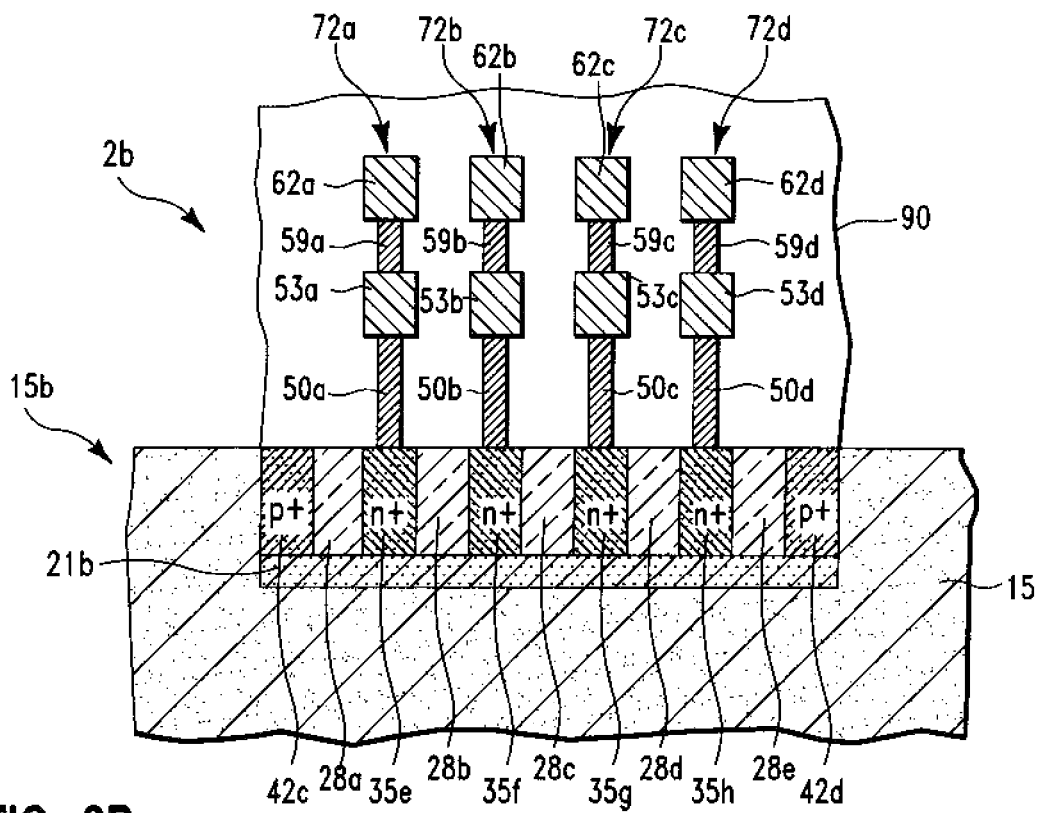
FIG. 3B illustrates an alternative semiconductor device to the semiconductor device of FIG. 3A, in accordance with embodiments of the present invention.

FIG. 3B illustrates an alternative semiconductor device 2b to the semiconductor device 2a of FIG. 3A, in accordance with embodiments of the present invention. In contrast with the semiconductor device 2a of FIG. 3A, the semiconductor device 2b comprises the substrate structure 15b of FIG. 2G.

Figure 4A:
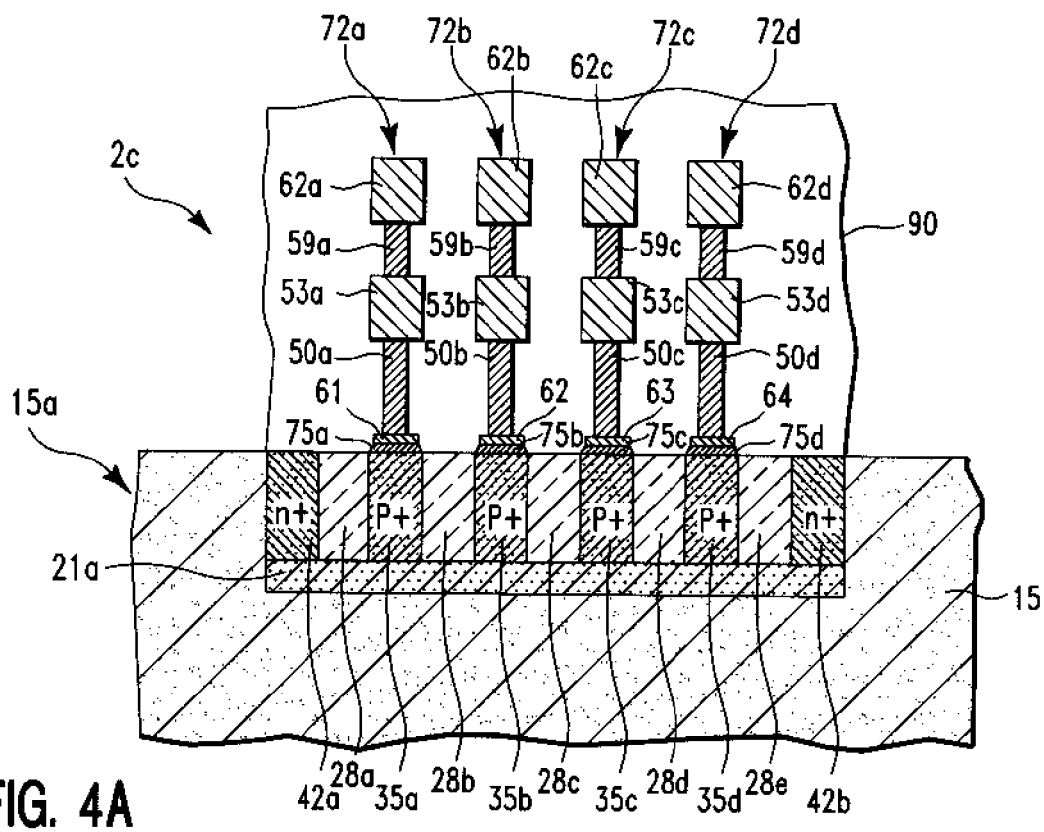
FIG. 4A illustrates an alternative semiconductor device to the semiconductor device of FIG. 3A, in accordance with embodiments of the present invention.

FIG. 4A illustrates an alternative semiconductor device 2c to the semiconductor device 2a of FIG. 3A, in accordance with embodiments of the present invention. In contrast with the semiconductor device 2a of FIG. 3A, the semiconductor device 2c of FIG. 4A comprises gate layers G1 . . . G4 and gate oxide layers 75a . . . 75d formed between the contacts 50a . . . 50d and doped regions 35a . . . 35d. The aforementioned configuration in FIG. 4A allows the capacitor Cm in FIG. 4A to achieve significantly higher capacitance values than the capacitor Cm in FIG. 3A because the gate layers G1 . . . G4 and gate oxide layers 75a . . . 75d formed between the contacts 50a . . . 50d and doped regions 35a . . . 35d form higher capacitance values. The gate layers G1 . . . G4 may comprise any material including, inter alia, polysilicon. The gate oxide layers 75a . . . 75d may comprise any dielectric material including inter alia, silicon dioxide, etc. The gate oxide layers 75a . . . 75d may comprise a high-K dielectric material. The gate oxide layer 75a is formed over the doped region 35a and the gate layer G1 is formed over the gate oxide layer 75a. The gate oxide layer 75b is formed over the doped region 35b and the gate layer G2 is formed over the gate oxide layer 75b. The gate oxide layer 75c is formed over the doped region 35c and the gate layer G3 is formed over the gate oxide layer 75c. The gate oxide layer 75d is formed over the doped region 35d and the gate layer G4 is formed over the gate oxide layer 75d. The capacitor Cm in FIG. 4A is high density capacitors each comprising a density of about 5.0 fF/um².

Figure 4B:
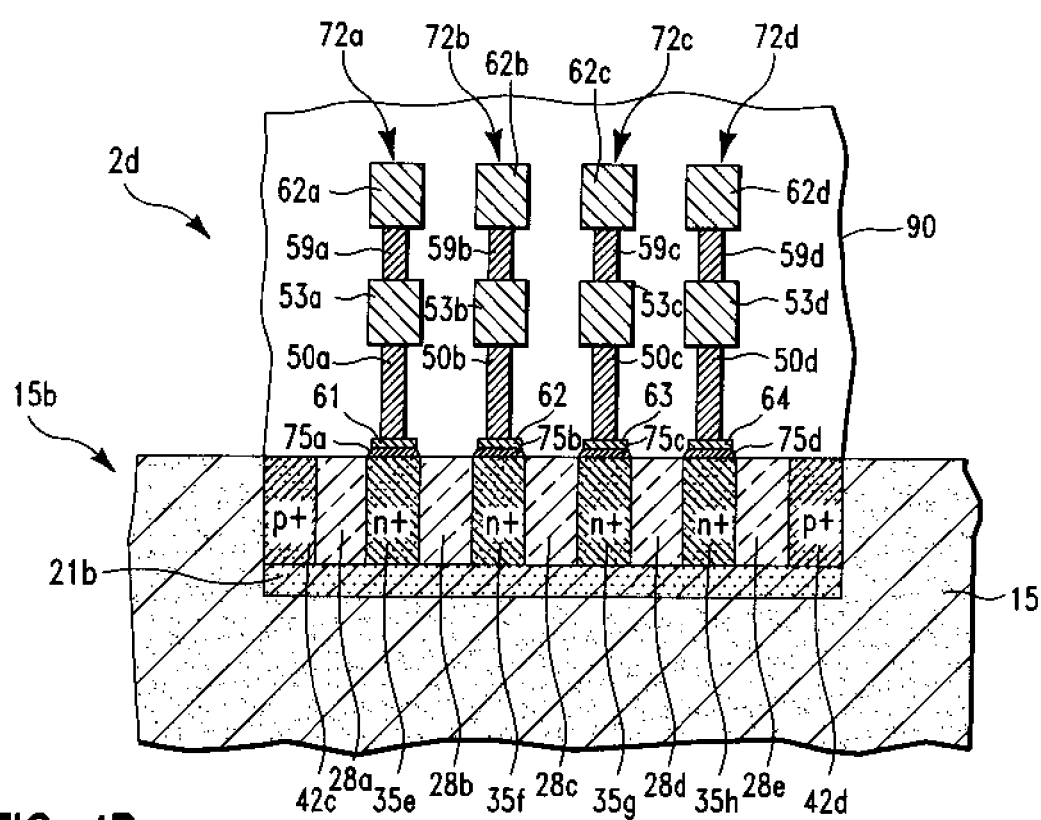
FIG. 4B illustrates an alternative semiconductor device to the semiconductor device of FIG. 4A, in accordance with embodiments of the present invention.

FIG. 4B illustrates an alternative semiconductor device 2d to the semiconductor device 2c of FIG. 4A, in accordance with embodiments of the present invention. In contrast with the semiconductor device 2c of FIG. 4A, the semiconductor device 2d of FIG. 4A comprises the substrate structure 15b of FIG. 2G.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for forming a structure, comprising:
   providing, a substrate;
   forming, a first doped region within said silicon substrate, wherein said first doped region comprises a first dopant having a first polarity;
   forming, a second doped region within said substrate and over first doped region, wherein said second doped region forms a first electrode of a capacitor;
   forming, a third doped region within said substrate and over first doped region, wherein said third doped region forms a second electrode of said capacitor, wherein each of said second doped region and said third doped region comprises a same second dopant having a second polarity, wherein said forming said second doped region and said forming said third doped region is performed simultaneously, and wherein said first doped region, said second doped region, and said third doped region in combination form a PN junction; and
   forming, a first shallow trench isolation structure between said second doped region and said third doped region, wherein said first shallow trench isolation structure isolates said second doped region from said third doped region, wherein said capacitor comprises a main capacitance, wherein said structure comprises a first parasitic capacitance and a second parasitic capacitance, wherein said main capacitance comprises a capacitance between said second doped region and said third doped region, wherein said first parasitic capacitance represents a parasitic connection between said second doped region and said first doped region, wherein said second parasitic capacitance represents a parasitic connection between said third doped region and said first doped region, wherein a first distance between said second doped region and said first doped region is about equal to a second distance between said third doped region and said first doped region, and wherein said first parasitic capacitance is about equal to said second parasitic capacitance.

2. The method of claim 1, further comprising:
   forming, a fourth doped region within said silicon substrate and over said second doped region, wherein said fourth doped region comprises said first dopant;
   forming, a fifth doped region within said silicon substrate and over third doped region, wherein said fifth doped region comprises said first dopant;
   forming, a second shallow trench isolation structure between said second doped region and said fourth doped region, wherein said second shallow trench isolation structure electrically isolates said second doped region from said fourth doped region, wherein each of said fourth doped region and said fifth doped region is biased electrically such that said PN junction is reverse biased, and wherein said symmetric capacitor is electrically isolated from said substrate; and
   forming, a third shallow trench isolation structure between said third doped region and said fifth doped region, wherein said third shallow trench isolation structure electrically isolates said third doped region from said fifth doped region.

3. The method of claim 2, wherein said first doped region is electrically connected to said fourth doped region and said fifth doped region, and wherein a voltage is electrically connected to said first doped region voltage through said fourth doped region and said fifth doped region.

4. The method of claim 2, wherein said first polarity comprises an opposite polarity as said second polarity.

5. The method of claim 2, wherein each of said first shallow trench isolation structure, said second shallow trench isolation structure, and said third shallow trench isolation structure comprises a material selected from the group consisting of an oxide material and a high-K dielectric material.

6. The method of claim 2, further comprising:
   forming, a first electrical contact over said second doped region;
   forming, a second electrical contact over said third doped region;
   forming, a first metal wire over and in electrical contact with said first electrical contact;
   forming, a second metal wire over and in electrical contact with said second electrical contact;
   forming, a first electrically conductive via over and in electrical contact with said first metal wire;
   forming, a second electrically conductive via over and in electrical contact with said second metal wire;
   forming, a third metal wire over and in electrical contact with said first electrically conductive via; and
   forming, a fourth metal wire over and in electrical contact with said second electrically conductive via.

7. The method of claim 6, wherein said first electrical contact is electrically connected said second doped region, and wherein second electrical contact is electrically connected to said third doped region.

8. The method of claim 6, further comprising:
   forming, a first layer of gate oxide over said second doped region;
   forming, a first poly-silicon gate over said first layer of gate oxide such that said first poly-silicon gate is located between said first layer of gate oxide and said first electrical contact;
   forming, a second layer of gate oxide over said third doped region; and
   forming, a second poly-silicon gate over said second layer of gate oxide such that said second poly-silicon gate is located between said second layer of gate oxide and said second electrical contact.

9. The method of claim 6, further comprising:
   forming, a dielectric over said silicon substrate and surrounding said first electrical contact, said second electrical contact, said first metal wire, said second metal wire, said first electrically conductive via, second electrically conductive via, said third metal wire, and said fourth metal wire.

10. The method of claim 1, wherein, said substrate comprises a material selected from the group consisting of silicon, silicon on insulator, GaAs, and InP.

* * * * *